United States Patent [19]

West

[11] Patent Number: 4,550,359
[45] Date of Patent: Oct. 29, 1985

[54] VOLTAGE TRANSIENT PROTECTION CIRCUIT FOR MOSFET POWER TRANSISTORS

[75] Inventor: Gerald W. West, Seattle, Wash.

[73] Assignee: Honeywell Inc., Minneapolis, Minn.

[21] Appl. No.: 578,922

[22] Filed: Feb. 10, 1984

[51] Int. Cl.[4] .............................................. H02H 9/04
[52] U.S. Cl. .................................. 361/56; 330/207 P; 361/91; 361/110; 361/111
[58] Field of Search .................... 361/6, 8, 13, 91, 110, 361/111, 56, 159; 363/22–26, 56, 132, 134; 330/207 P, 298; 307/131

[56] References Cited

U.S. PATENT DOCUMENTS 4,389,702 6/1983 Clemente et al. ................. 363/56 X

FOREIGN PATENT DOCUMENTS 2336463 2/1975 Fed. Rep. of Germany ........ 363/22
694957 10/1979 U.S.S.R. ................................. 363/24

OTHER PUBLICATIONS

"VMOS Transistors As Fast Switches", Elektron Entwickl, (Germany), vol. 13, No. 10, pp. 66–72, 10/78.

Primary Examiner—Harry E. Moose, Jr.
Attorney, Agent, or Firm—Alfred N. Feldman

[57] ABSTRACT

A pair of MOSFET power transistors are connected in a push-pull configuration to drive a tapped transformer and a load. A pair of diodes and an energy coupling circuit containing a capacitor and resistor in parallel bias the transformer primary in such a manner as to limit transients in a nonconducting MOSFET when the other MOSFET is conducting, aided by a drop in voltage at an inductor (ferrite bead) network which develops at the moment of MOSFET transistor conduction. This is due to a momentary change in the impedance ratio.

5 Claims, 3 Drawing Figures

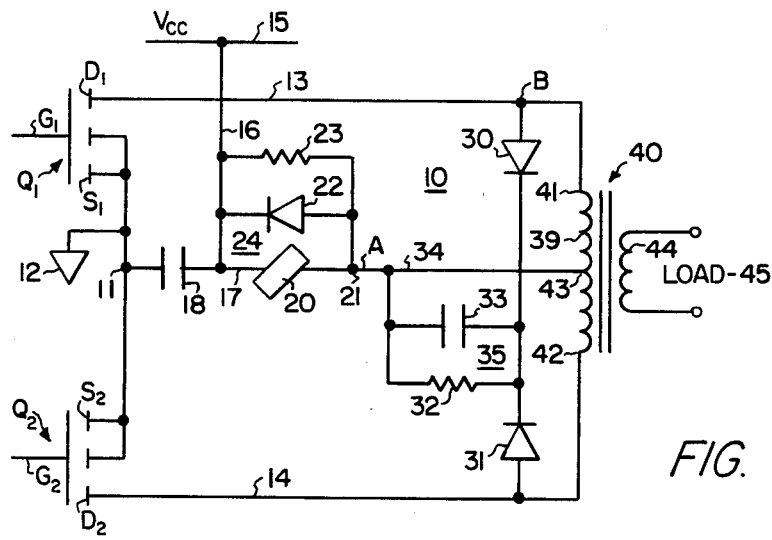
FIG. 1
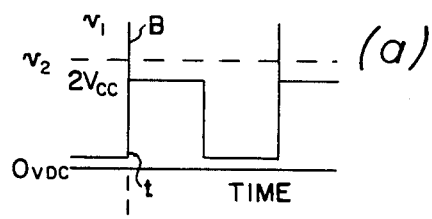
FIG. 2
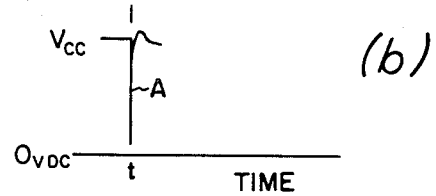

VOLTAGE TRANSIENT PROTECTION CIRCUIT FOR MOSFET POWER TRANSISTORS

The Government has rights in this invention pursuant to Contract Number N00024-79-C-6277, awarded by the Naval Sea Systems Command of the Department of the Navy.

BACKGROUND AND SUMMARY OF THE INVENTION

Power metal oxide semiconductor field effect transistors (MOSFETs), while rugged in their ability to withstand current surges, are particularly sensitive to damage caused by voltage transients. The transient protection circuits typically used to protect the MOSFETs from high voltage spikes conventionally use resistance-capacitor (RC) snubber circuits. RC snubber circuits tends to be "power hungry", and utilize capacitors of rather large magnitude thereby making the devices relatively expensive and impractical in a modern, efficient power amplifier circuit.

The present invention is directed to a voltage transient protection circuit for MOSFETs that avoids the need for RC snubber circuits. The present invention utilizes a transient protection circuit that is connected between two MOSFET drain terminals and the output transformer primary winding of a push-pull output circuit. During operation a relatively small magnitude capacitor is raised to a direct current voltage level equal to approximately twice the applied circuit voltage. This arrangement is effectively utilized to damp out transients by limiting the transient level to a voltage of approximately five percent over the voltage of twice the source voltage. This level of voltage is not harmful and can be readily tolerated by the MOSFETs.

In accordance with the present invention, there is provided a voltage transient protection circuit for a pair of metal oxide semiconductor field effect transistors (MOSFETs) operated in a push-pull circuit with said MOSFETs each having a drain connection, a source connection, and a gate connection, including: a transformer having a tapped primary winding and a pair of primary end windings; a first of said pair of end windings connected to a first of said drain connections, and a second of said pair of end windings connected to a second of said drain connections; a pair of diodes with each of said diodes connected to a separate transformer end winding with said diodes further connected in common to a first end of an energy dissipation means; said energy dissipation means having a second end connected to said transformer tapped winding; said transformer tapped winding further connected by circuit means to a source of potential for said MOSFETs and with said source of potential further including a circuit ground; and both of said MOSFETs source connections being connected to said circuit ground; said diodes and said energy dissipation means limiting voltage transients in said protection circuit to a level that is not harmful to said MOSFETs.

BRIEF DESCRIPTION OF THE DRAWINGS

FIG. 1 is a schematic drawing of the voltage transient protection circuit, and;

FIGS. 2(a) and (b) are a graph of time versus two voltages.

DESCRIPTION OF THE PREFERRED EMBODIMENT

In FIG. 1, a schematic diagram of the voltage transient protection circuit is disclosed generally at 10. The input to the circuit is a pair of metal oxide semiconductor field effect transistors (MOSFETs) identified as $Q_1$ and $Q_2$. The MOSFET $Q_1$ has a gate $G_1$, a drain $D_1$, and a source $S_1$. The MOSFET $Q_2$ has a gate $G_2$, a drain $D_2$, and a source $S_2$. The sources of the two MOSFETs have a common conductor 11 that is connected to a circuit ground 12 while the drains $D_1$ and $D_2$ are connected to a pair of individual conductors 13 and 14. The gates $G_1$ and $G_2$ of the MOSFETs $Q_1$ and $Q_2$ extends to any type of a push-pull type of drive circuit, the details of which are not shown and are not material to the present invention. It is understood that the gates $G_1$ and $G_2$ are driven in a push-pull manner to operate the MOSFETs $Q_1$ and $Q_2$. The driving circuitry will include a means to separate the gate signals so that only one of the MOSFETs $Q_1$ or $Q_2$ can be conductive at any one time.

A source of operating voltage is connected to the system at 15 and is identified as $V_{CC}$. The voltage from $V_{CC}$ is provided on a conductor 16 to a lead 17 that is coupled by a capacitor 18 to the ground 12 at the common conductor 11 between the sources $S_1$ and $S_2$. The conductor 17 is connected through a ferrite bead 20 or any other type of inductive element. The ferrite bead is a form of inductive element having an inductive reactance and some small amount of resistance. The ferrite bead 20 is connected at node 21 to a diode 22 and a resistor 23 that are in turn connected to the conductor 16 or the voltage source $V_{CC}$. The resistor 23 and the diode 22 are in parallel with the ferrite bead 20. The ferrite bead 20, the diode 22, and the resistor 23 forms an energy dissipation means generally indicated at 24.

The voltage transient protection circuit further includes the conductors 13 and 14 through a pair of diodes 30 and 31 which are in turn connected in series with a parallel combination of a resistor 32 and a capacitor 33. This combination is connected to a conductor 34 that joins the energy dissipation means 24 at node 21. The diodes 30 and 31, along with the resistor 32 and the capacitor 33, form a further energy dissipation means generally disclosed at 35.

The voltage transient protection circuit is completed by a transformer generally disclosed at 40 having a center tapped primary winding 39 that has a first end 41 connected to the conductor 13 and the diode 30, while having a second end 42 connected to the conductor 14 and the diode 31. A center tapped connection is provided for the transformer at 43, and typically would be a center tap connection that is connected to the conductor 34. The transformer means 40 has an output secondary winding 44 that is adapted to be connected to a load 45. The particular type of input and output to the present circuit is of little specific interest and is therefore not disclosed in detail.

The operation of the circuit will be discussed in connection with FIG. 2. At the start of conduction of either of the MOSFETs $Q_1$ or $Q_2$ in a push-pull circuit, a voltage transient often develops in the opposite drain circuit from the transistor that is conducting. As this transient attempts to develop, there are two factors in the present circuit design that tend to prevent this from happening. Any voltage transient that develops above twice the applied $V_{CC}$ voltage is shunted back to the bus at conductor 34. This is accomplished through the capacitor 33 and simultaneously with the voltage drop on the transformer side of the inductive component at the bus conductor 34. In this case, the inductive component is a ferrite bead 20.

Energy stored in the ferrite bead or inductor 20 is dissipated in a small resistor 23. The transient protection function is accomplished at the moment of transistor conduction when the voltage drop at A in FIG. 2(b) or conductor 34 pulls down any developing transient at either of the transistor drain terminals $D_1$ or $D_2$, as is indicated at B in FIG. 2(a).

As shown in FIG. 2 at the moment of the transistor conduction at a time t, the voltage at node 21 will drop sharply. This action provides a conduction path through the capacitor 33, and any developing transients on the nonconducting transistor drain bus will be provided for. A transient voltage, damaging to a MOSFET power transistor, that would normally develop to a level of $v_1$, as shown in FIG. 2(a) is pulled or held to less than $v_2$. In practical terms, $v_2$ can be held to less than five percent over the voltage level of two times the $V_{CC}$ voltage on conductor 15. The resistor 23 will dissipate the stored energy in the ferrite bead 20, while the diode 22 will clamp the voltage at 21 from rising above a diode drop above the $V_{CC}$ voltage on conductor 15. With the present circuit the resistor 32 can be of a relatively small size. The power lost in this type of a transient protection circuit is much less than the power dissipated in a customary RC snubber circuit.

The invention disclosed in the present circuit configuration provides for transient protection in a push-pull amplifier that utilizes MOSFETs that handle substantial current levels. The circuit arrangement provides for biasing against a transient in such a manner to limit the amount of power drawn to a relatively low level, and as such, has the distinct advantage over more conventional circuitry used for protection of MOSFET power transistors. The present circuit is subject to numerous modifications and the applicant wishes to be limited in the scope of his invention solely to the scope of the appended claims.

The embodiments of the invention in which an exclusive property or right is claimed are defined as follows:

1. A voltage transient protection circuit for a pair of metal oxide semiconductor field effect transistors (MOSFETs) operated in a push-pull circuit with said MOSFETs each having a drain connection, a source connection, and a gate connection, including: a transformer having a tapped primary winding and a pair or primary end windings; a first of said pair of end windings connected to a first of said drain connections, and a second of said pair of end windings connected to a second of said drain connections; a pair of diodes with each of said diodes connected to a separate transformer end winding with said diodes further connected in common to a first end of an energy dissipation means; said energy dissipation means having a second end connected to said transformer tapped winding; said energy dissipation means including a parallel combination of a capacitor and a resistor; said transformer tapped winding further connected by circuit means to a source of potential for said MOSFETs and with said source of potential further including a circuit ground; second energy dissipation means having inductive means in parallel with a parallel connected diode means; said second energy dissipation means connecting said tapped primary winding to said source of potential; and both of said MOSFETs source connections being connected to said circuit ground; said diodes and said energy dissipation means limiting voltage transients in said protection circuit to a level that is not harmful to said MOSFETs.

2. A voltage transient protection circuit as disclosed in claim 1 wherein said source of voltage is coupled to said circuit ground with a further capacitor.

3. A voltage transient protection circuit as disclosed in claim 1 wherein said inductive means is a ferrite bead; and said parallel connected diode means is a parallel combination of a diode and a resistor.

4. A voltage transient protection circuit as disclosed in claim 3 wherein said first energy dissipation means includes a capacitor.

5. A voltage transient protection circuit as disclosed in claim 4 wherein said first energy dissipation means further includes a resistance connected in parallel circuit with said capacitor of said first energy dissipation means.

* * * * *